United States Patent [19]
Mears

[11] 4,142,226
[45] Feb. 27, 1979

[54] MULTI-CONTACT ELECTRICAL EDGE CONNECTOR FOR DISPLAY PANELS

[75] Inventor: Adrian L. Mears, Cheltenham, England

[73] Assignee: The Secretary of State for Defence in Her Britannic Majesty's Government of the United Kingdom of Great Britain and Northern Ireland, London, England

[21] Appl. No.: 843,189

[22] Filed: Oct. 18, 1977

[30] Foreign Application Priority Data

Oct. 29, 1976 [GB] United Kingdom .............. 45214/76

[51] Int. Cl.$^2$ .............................................. H05K 1/07

[52] U.S. Cl. .................................... 361/380; 361/413; 339/17 CF

[58] Field of Search .............. 339/17 C, 17 CF, 17 E, 339/17 LM, 17 LC, 17 M; 361/380, 400, 401, 406, 410, 413, 426, 416-420; 174/52 FP, 52 PE

[56] References Cited

U.S. PATENT DOCUMENTS

| | | | |
|---|---|---|---|
| 2,963,626 | 12/1960 | DuVal, Jr. | 361/410 |
| 3,448,345 | 6/1969 | Koehler, Jr. | 361/413 |
| 3,671,813 | 6/1972 | Wilcox | 361/413 |
| 3,903,385 | 9/1975 | Moyer | 361/413 |
| 3,910,664 | 10/1975 | Pauza | 339/17 CF |

*Primary Examiner*—Gerald P. Tolin
*Attorney, Agent, or Firm*—Pollock, Vande Sande and Priddy

[57] ABSTRACT

The invention concerns an edge connector for mounting on the edge of flat panel displays, e.g. liquid crystal or electroluminescent display panels, arranged in matrix format. The edge connectors have mounted therein drive electronics, e.g. serial input parallel output shift registers. Two series of conductors are carried by the edge connector body, one series of conductors connect with external control circuits and the other series of conductors connect with addressing electrodes on a display panel. Faulty drive electronics are easily replaced by unclipping the edge connector from the panel and substituting a new edge connector complete with new drive electronics.

5 Claims, 5 Drawing Figures

MULTI-CONTACT ELECTRICAL EDGE CONNECTOR FOR DISPLAY PANELS

The present invention relates to edge connectors for making connections to electro-optic display panels, particularly for connecting drive electronics to the panel addressing conductors.

Electro-optic display panels are being used increasingly for the presentation of data, e.g. words and numbers. They usually comprise one or more substrates for physical support, a series of electro-optic display zones or 'elements' and an arrangement of addressing conductors for applying voltages across selected elements to cause those elements to change some optical property, e.g. to emit light. The display elements may for example be electroluminescent, liquid crystal or miniature plasma discharge elements.

In a first format the addressing conductors may be arranged as separate connections to each of the individual elements, together with a single common connection to all of the elements. An alternative second format for the addressing conductors comprises a matrix of two intersecting grids with the display elements at the intersections, so that when a suitable voltage is applied between any conductor in one grid and any conductor in the other grid the element at the intersection of those conductors is energized i.e. matrix addressing.

These two addressing conductor formats usually have a common feature in that they include a series of parallel conductors (which in the first format are the individual element connections and in the second format are the conductors of one of the grids), and these conductors terminate near one edge of the panel. It is necessary to connect these terminals to 'drive' and 'control' electronics. The control electronics generates a number sequence, in an essentially serial manner, which represents those conductors in the series which are to receive an energizing electrical potential. The drive electronics converts the output of the control electronics into an essentially parallel form and applies the energizing potential to the appropriate addressing conductors.

Usually the drive electronics is mounted as an integrated circuit of transistor chips on a printed circuit board. Connection between the drive electronics and the addressing conductors is made by a conventional edge connector. This is an insulating structure which is plugged on the edge of the panel and which is provided with a series of pins which connect to the addressing conductors on one side and to the drive electronics output terminals on the other side, these terminals being deposited on the printed circuit board.

This arrangement for connecting the drive electronics to the addressing conductors has the disadvantage that if the drive electronics fails and requires replacement it is not easily accessible and is attached to a component which is too costly to dispose of, namely the printed circuit board. Thus, the printed circuit board has to be detached from the edge connector and the drive electronics has to be detached from the printed circuit board and replacement electronics fitted on the board. The board then has to be reconnected to the edge connector. This replacement procedure is considerably time consuming.

According to the present invention an edge connector for an electro-optic display panel comprises an electrically insulating body, drive electronics connected to the body and having a plurality of input and output connections with a larger number of output connections than input connections, a first series of conductors connected to the drive electronic input connections and mounted in the body for external connection to control electronics, a second series of conductors connected to the drive electronic output connections and mounted in the body for connection with addressing conductors of the panel, and means for retaining the edge connector on a panel so that each conductor in the second series of conductors makes electrical contact with a separate one of the addressing conductors.

The drive electronics may for example be at least one serial input parallel output shift register or a serial input parallel output shift register with output latches, or a binary decoder, with or without output latches. An important advantage of the present invention is that the inputs to the driven circuit can be serial, so that when the edge connectors are assembled onto the display panel very few electrical connections are required to the external control circuitry.

The first and second series of conductors are preferably shaped to protrude from the body to enable them to make their respective contacts. The conductors of the first series may be arranged to make contact with corresponding conductors on a printed circuit board pressed against the package and connected to the control electronics.

The conductors of the second series may be bent so that they can grip one face of the panel as well as make contact with its addressing conductors. The conductors of the first series may extend into bent portions which can grip the other face of the panel, alternatively, the body may be provided with teeth to grip the other face of the panel.

An edge connector as described may be made cheaply particularly if the insulating body is a moulded plastics material. This allows the edge connector to be replaced as a single unit if the drive electronics fails and this replacement procedure is simple because it merely involves unplugging the edge connector from the panel.

Embodiments of the present invention will now be described by way of example with reference to the accompanying drawings, in which:

FIGS. 1, 3, and 4 are cross-sectional side views of alternative edge connectors plugged on the end of a display panel;

Figure 1:
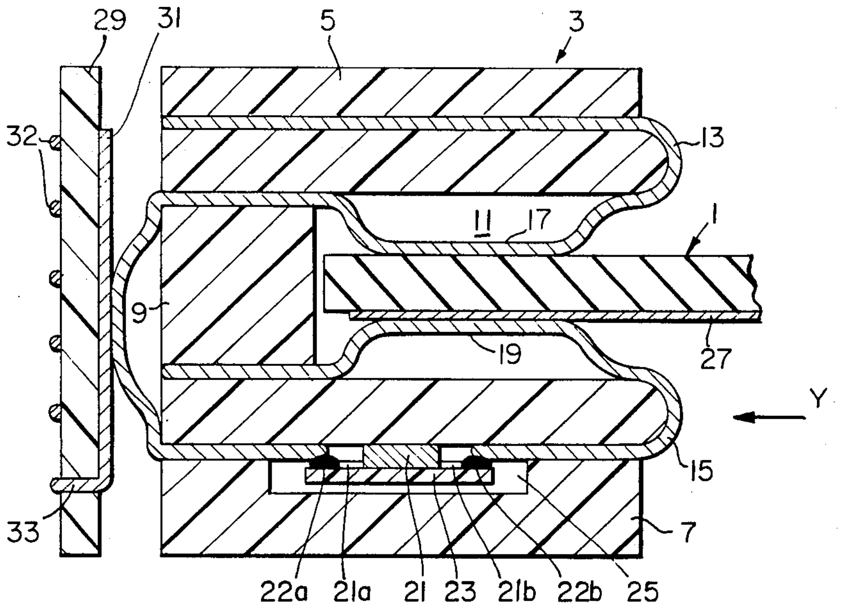
Figure 2:
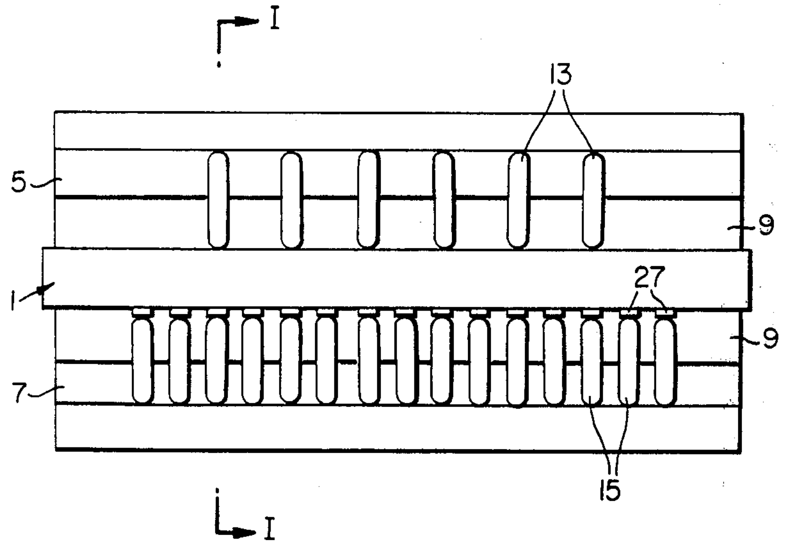
FIG. 2 is an end view of the edge connectors and panel shown in FIG. 1.

In FIG. 1, which is a cross-section in the plane defined by the line I—I in FIG. 2, and FIG. 2 which is an end view in the direction Y along the width of the panel as shown in FIG. 1, the edge connector is indicated by a reference numeral 3 and the display panel by a reference numeral 1. In cross-section (FIG. 1) the edge connector comprises two arms 5, 7 pointing along the width of the panel 1, and a strip 9 joining the arms 5, 7 at one end thereof.

The panel 1 has a length which roughly matches an integral number of lengths of the connector 3 (FIG. 2) and has one edge accommodated in the space, indicated by a reference numeral 11, between the arms 5, 7 and the strip 9. Conducting wires 13 are provided at intervals along the length of the connector 3 and occupy positions in parallel planes perpendicular to the length of the connector 3. The wires 13 are embedded in the arm 5 and emerge from the end of the arm 5 distant from the strip 9 where they are bent back inside the space 11 and run through the space 11 and the strip 9 emerging behind the strip 9. The wires 13 are then bent back inside the arm 7 in which they are embedded. Wires 15 which are located in planes parallel to those of the wires 13 are provided along the length of the connector 3. The wires are also embedded in the arm 7 and emerge from the end of the arm 7 distant from the strip 9 where they are bent back inside the space 11. The wires 15 run through the space 11 below the wires 13 and are embedded in the strip 9.

Inside the space 11 the wires 13 and 15 are bent in the form of ridges 17, 19 respectively to act as springs which are pushed apart to grip the edge of the panel 1. The ridges 19 also make electrical contact individually with striped 'Y' electrodes 27 on the underside face of the panel 1.

An integrated circuit drive chip 21 carried on an electrically insulating, e.g. ceramic, mount 23 is housed in a recess 25 inside the arm 7. The chip 21 has electrical terminals 21*a* (one only shown in FIG. 1) on one side and electrical terminals 21*b* (one only shown in FIG. 1) on the other side. The electrical terminals 21*a*, 21*b* are connected to contact lands 22*a*, 22*b* respectively on the mount 23 and the wires 13 and 15 are soldered individually to the lands 22*a* and the lands 22*b* respectively. Several such integrated circuit chips may be mounted on mount 23.

A printed circuit board 29 is located against the rear side of the connector 3. On its front face the board 29 has a number of conducting strips 31 equal to the number of wires 13 and these are arranged to make electrical contact individually with the sections of the wires 13 extending from the arm 5 to the arm 7. On its rear face the board 29 has conducting strips 32 perpendicular to the strips 31. The strips 31 and 32 are individually connected by intersection joints 33 formed through the board 29. The strips 32 are connected to conventional logic chips and voltage supply rails (not shown) forming control electronics.

The logic chips within the control electronics emit a series of conventional signal pulses identifying the positions of the electrodes 27 on the panel 1 to which electrical operating potentials are to be applied. These signals are routed to the chip 21 via the appropriate conducting strips 32, 31, and wire 13. Under the control of these signals the chip 21 acts as a multi-element switch and routes electrical potential signals from another appropriate wire 13 (and strips 31 and 32) to the selected Y electrodes 27. Selected display elements (not shown) on the panel 1 are energized when these potential signals coincide at the elements with similar potential signals of opposite polarity on X electrodes (not shown) on the upper face of the panel 1 running perpendicular to the Y electrodes 27.

The wires 15 are shown larger in number than the wires 13 since the number of striped Y electrodes 27 on a typical display panel is much greater than the number of control and voltage supply inputs to a typical drive circuit chip 21 required to drive the panel. For example, when the chip 21 is a serial input parallel output shift register, the shift register input is via conductors 13 and the parallel output via conductors 15 to the addressing electrodes 27.

Figure 3:
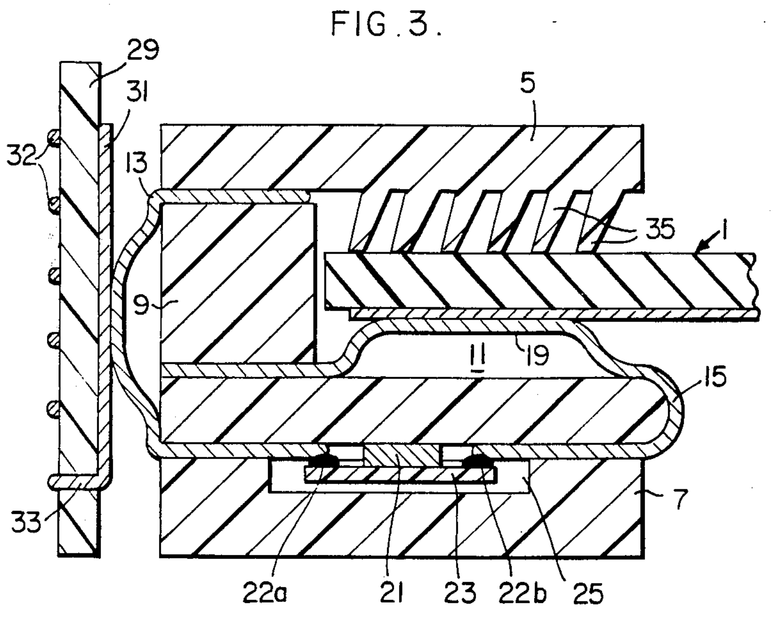

The edge connector shown in FIG. 3 is identical with that shown in FIG. 1 except that the wires 13 do not pass through the space 11 but extend only between the contact lands 22*a* and the joint between the strip 9 and the arm 5. The upper face of the panel 1 is gripped in this case by teeth 35 specially provided along the lower face of the arm 5. Otherwise the package 3 is employed in the same way as that described above with reference to FIG. 1.

Figure 4:
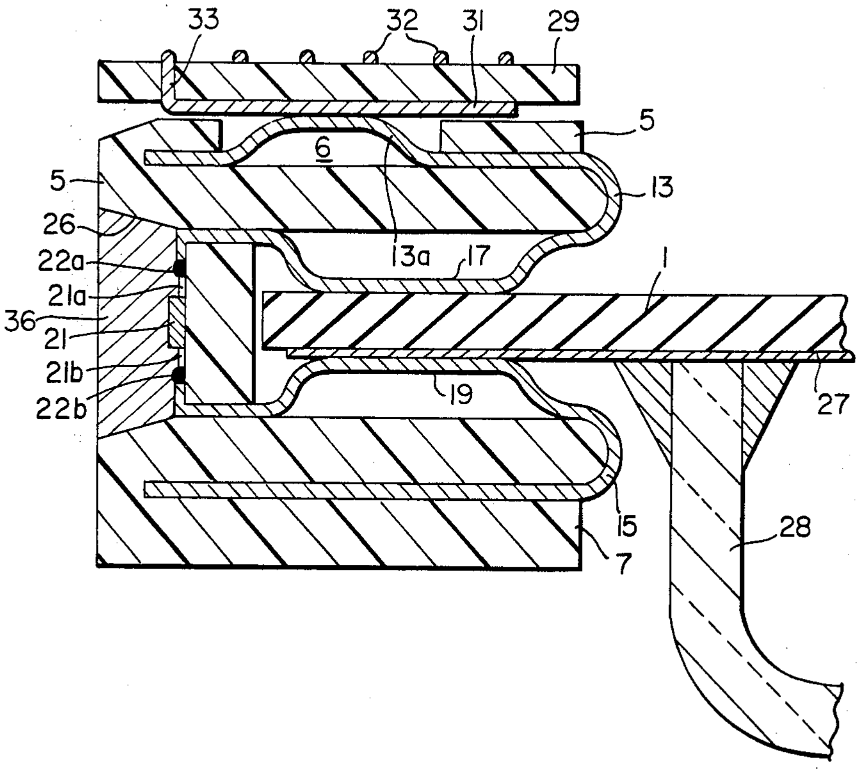

The edge connector shown in FIG. 4 is similar to that shown in FIG. 1 but in this case the printed circuit board 29 is located adjacent to the top surface of the arm 5 where its strips 31 make contact with the wires 13. The arm 5 has a recess 6 and the wires 13 have ridges 13*a* in the recess 6 to facilitate the contact. The chip 21 together with its terminals 21*a*, 21*b* and lands 22*a*, 22*b* are located in this case in a cavity 26 inside the strip 9. The wires 13 and 15 extend into the cavity 26 to make contact with the lands 22*a*, 22*b* respectively. Apart from these alternative locations of the board 29 and the chip 21 the package is employed in the same way as described above with reference to FIG. 1. An encapsulating covering 28 (omitted from FIGS. 1, 2 and 3 for clarity) is shown in FIG. 4 for completeness. The covering 28, which may for example be made of glass, protects the active areas of the panel 1 against atmospheric contamination.

Figure 5:
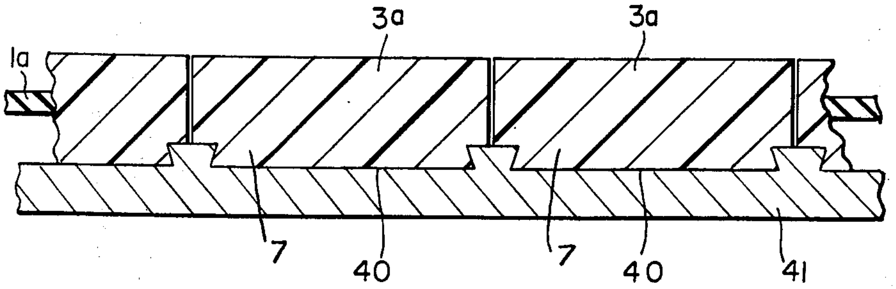
FIG. 5 is a cross-sectional end view of a row of edge connectors plugged on the edge of a display panel.

The arrangement shown in FIG. 5 illustrates how several drive circuits 3*a*, which are incorporated into edge connectors as described above with reference to FIG. 1, 3 or 4, may be employed to address adjacent zones on a single large area panel 1*a* (which may be a composite of several small panels). The edge connectors are shaped so that their arms 7 fit into dovetail recesses 40 provided in a single metal locating block 41 so that they may be fitted together with minimum space between them.

I claim:

1. An edge connector for mounting on an edge of an opto-electric display panel which has a plurality of addressing electrodes to which electric voltage are applied to cause an observable display on the panel, said edge connector comprising:

a. an electrically insulating body for receiving the edge of a display panel between two parts of the edge connector, b. drive electronics fixed to said insulating body and having a plurality of input terminals and a plurality of output terminals with a greater number of output terminals than input terminals, said drive electronics being capable of routing electrical signals applied to its said input terminals to appropriate ones of its said output terminals determined by the signals received on said input terminals, c. a first series of electrical conductors connected one to each of said input terminals and mounted in said body for external connection to control electronics, d. a second series of electrical conductors connected one to each of said output terminals and mounted in said body for connection with the addressing electrodes on the display panel, and e. means for retaining the edge connector on the display panel with the electrical conductors of said second series for electrical contact respectively with separate ones of the addressing electrodes on the display panel.

2. An edge connector according to claim 1 wherein the means for retaining the edge connector on the display panel comprises ridges in the first and the second series of electrical conductors.

3. An edge connector according to claim 1 wherein the means for retaining the edge connector on the display panel comprises ridges in the second series of electrical conductors and teeth projecting from the body.

4. An edge connector according to claim 1 wherein the drive electronics include at least one serial input parallel output shift register.

5. An edge connector according to claim 1 wherein the drive electronics include at least one serial input parallel output binary decoder.

* * * * *